United States Patent
Backhaus

(10) Patent No.: US 6,986,950 B2
(45) Date of Patent: Jan. 17, 2006

(54) PARTITION OR METHOD FOR PRODUCING A PARTITION FOR A MULTILAYER PRESSED PACKET

(75) Inventor: Dieter Backhaus, Sexau (DE)

(73) Assignee: Monika Backhaus, Sexau (DE)

( * ) Notice: Subject to any disclaimer, the term of this patent is extended or adjusted under 35 U.S.C. 154(b) by 0 days.

(21) Appl. No.: 10/749,280

(22) Filed: Dec. 31, 2003

(65) Prior Publication Data

US 2004/0211494 A1    Oct. 28, 2004

Related U.S. Application Data

(63) Continuation of application No. PCT/DE02/02418, filed on Jul. 3, 2002.

(30) Foreign Application Priority Data

Jul. 4, 2001   (DE) .......................... 101 31 887

(51) Int. Cl.
  B32B 15/18   (2006.01)
  B32B 33/00   (2006.01)
  H05K 1/03    (2006.01)

(52) U.S. Cl. .................. 428/615; 428/635; 428/674; 428/676; 428/677; 428/681; 428/684; 428/687; 428/926; 29/17.1; 29/17.3; 29/830; 174/255; 174/256

(58) Field of Classification Search ............ 428/615, 428/635, 674, 676, 677, 681, 684, 687, 926; 29/17.1, 17.3, 830; 148/516, 532, 537; 174/255; 174/256
See application file for complete search history.

(56) References Cited

U.S. PATENT DOCUMENTS 6,130,000 A   10/2000   Frater .................. 428/687

FOREIGN PATENT DOCUMENTS

DE   297 19 716   1/1998

OTHER PUBLICATIONS

Einfuhrung in Die Multilayer–PreBtechnik;mit 120 Abbildungen und 16 Tabellen Dipl. Ing. (FH) Manfred Huschka, 1988, no month given.

http://www.sten.fi/main/suomi/kirjasto/N000DE.pdf; Nichtrostende Cr–Stahle/Stainless chromium steels; no date given.

*Primary Examiner*—Robert R. Koehler
(74) *Attorney, Agent, or Firm*—Caroline M. Nash

(57) ABSTRACT

The invention relates to a partition (1) or a method for producing a partition (1) for a multilayer pressed packet (3), wherein the partition (1) can be placed as a pressing sheet in the composite of a multilayer pressed packet (3) to be produced, especially between two multilayers (2). The unfavorable image transfer between the multilayers (2) that has occurred in the prior art up to now is cost-effectively prevented in that the partition (1) is implemented as a steel sheet, but not as a high-grade steel sheet, and that the steel sheet—at a temperature of essentially 180θC—possesses a tensile strength of at least $Rm\ \tau\ 500$ Mpa and/or—at a temperature of essentially 180θC—a yield strength of at least $Rp_{0.2}\ \tau\ 470$ MPa.

35 Claims, 1 Drawing Sheet

PARTITION OR METHOD FOR PRODUCING A PARTITION FOR A MULTILAYER PRESSED PACKET

BACKGROUND OF THE INVENTION

This application is a continuation application of PCT/DE02/02418 filed Jul. 3, 2002 which claims priority of German Application DE 101 31 887.1 filed Jul. 4, 2001, now abandoned. Priority is claimed under 35 USC 119(a)–(d) or (f) or 365(b) or (c) and under 35 USC 120.

The invention relates to a partition for use in the production of one or more multilayers or a multilayer pressed packet. The invention furthermore relates to a method for producing a corresponding partition, and a method for producing a multilayer pressed packet.

Various designs of partitions for use in the production of a multilayer pressed packet, or various methods for producing a multilayer pressed packet, that is for the pressing of multilayer printed circuit boards, are known in the state of the art. The pressing of the multilayers (printed circuit boards) generally takes place in multi-plate or vacuum presses, whereby the individual layers of the multilayer are correspondingly pressed together with one another at a temperature of ca. 180θC.

In general to accomplish this, first a pressed packet body is created within a suitable press. In this, several multilayers are placed one on top of another between two press plates, the corresponding pressing tools and press pads, and are separated from one another by corresponding partitions or pressing sheets. Each individual multilayer—ordinarily—is constructed as a multilayer. Namely it comprises several sheet molding compound layers, separated from one another by laminate layers. Between the individual laminate layers or sheet molding compound layers, corresponding copper foils are provided for the realization of corresponding wiring paths. (The individual layers may also be referred to as "plies".)

Various problems now exist in the production of the multilayer itself. On one hand, due to the thermal expansion of the partitions, an unfavorable displacement/movement of the individual layers of the multilayer (the sheet molding compound or the laminate layers and/or also the copper foils placed between them) can occur. On the other hand, it is also important that with the help of the partitions, the pressure within the multilayer pressed packet also be evenly transferred to the individual sheet molding compound or laminate layers of the multilayer pressed packet, in order to produce an optimal connection in a multilayer and to prevent any slipping to one side of the individual layers as far as possible.

According to DE 38 44 498 A1, a deformation of multilayer circuits that are pressed together and an uneven copper surface can be prevented by using vacuum and isostatic pressing techniques in the pressing process. In this process, additional plates are supported in a floating manner and are thermally insulated, to keep the press plates cool during the heating of the multilayer press packet. The disadvantage here is that during the heating process epoxy resin that is exuded can bond the edges of the multilayer circuit together.

According to DE 35 07 568 C2, a slippage of the sheet molding compound layers to one side can be prevented by means of an anti-slip device. This can, however, prevent a possible leakage of the sheet-molding compound to the sides of the packet only if the copper foils are selected somewhat larger than the other layers, so that the sheet-molding compound can run off onto them. At any rate, this method requires a longer heating period, and the heat penetration is substantially less even than when, for example, aluminum sheets are used as the partitions.

According to DE 41 16 543 A1, a partition made of high-grade steel is used, which has a specific heat expansion coefficient that approximates the expansion coefficient of the copper. In this manner, surface tension is prevented to the greatest possible extent, but the time required to heat this high-grade steel sheet is correspondingly long.

For this reason, in the past people have gone to using predominantly aluminum sheets of certain alloys as partitions, which can better and more evenly conduct the heat. In all the methods named above, the copper foil and the corresponding partition must be fitted together with the other layers by hand (manually) by specially trained personnel, in an assembly room provided for this purpose. One problem with this, among others, is that the often very thin and thus sensitive copper foils become rapidly crushed in this process.

The above-described partitions used or methods for producing multilayer pressed packets are not yet optimal for the next generation of printed circuit boards (multilayers), especially for UMTS [universal mobile telecommunication system] technology. The wiring paths are becoming narrower and narrower, while at the same time more and more must be accommodated on decreasing surface areas, especially with the help of "HDI-high density interconnect technology". Because the copper foil to be used is becoming thinner and thinner, with thicknesses of <12 Πm or even 5 Πm already being mentioned, this also increases the danger that in the pressing of the multilayers, the wiring paths of the inner layers could press through the outer copper foils. When this effect occurs it is referred to as a so-called "image transfer". The problem with this is an uneven abrasion of the thickness during etching, and corresponding inaccuracies with boring. And especially, these extremely thin outer copper foils can no longer be manually applied. They must therefore also be produced as a composite using a partition or pressing sheet, as is described in DE 198 31 461 C1.

Thus in DE 198 31 461 C1 a method for the partial joining of copper foils of any type and thickness using an aluminum pressing sheet (partition) of any alloy and thickness is described, in which a composite of aluminum pressing sheet and copper foils is produced, whereby this composite is used in the production of corresponding multilayer pressed packets. The problem with this, however, is that a partition or pressing sheet made of aluminum or a suitable aluminum alloy that will have sufficient hardness to prevent the above-described "image transfer" cannot be produced. The aluminum alloys that have been used up to now as the above-named aluminum pressing sheet currently possess a strength of Rm 400 Mpa. The pressing of the multilayer takes place at a temperature of ca. 180θC over a period of ca. 90 minutes. At this temperature, the strength of the aluminum pressing sheet drops to ca. Rm 360 Mpa. As a result, the use of known partitions presents problems for the next generation of printed circuit boards.

It is thus the object of the invention, based upon the initially mentioned partitions, or the above-described methods, to create and refine a partition for use in the production of a multilayer or a multilayer pressed packet, or the method for producing a multilayer or a multilayer pressed packet, such that the so-called "image transfer" is prevented in a cost-effective manner for the partition.

SUMMARY OF THE INVENTION

The above-stated objective is now accomplished for the partition in accordance with the invention, in that the partition is implemented as a steel sheet rather than a high-grade steel sheet, in that the steel sheet at a temperature of essentially 180°C possesses a tensile strength of at least Rm ≥ 500 MPa and/or at a temperature of essentially 180°C a yield strength of at least $Rp_{0.2}$ ≥ 470 MPa.

For the method for producing a partition for a multilayer pressed packet, the above-stated object is now attained pursuant to the invention in that the partition is made of a steel sheet and not of high-grade steel, and in that the steel sheet at a temperature of essentially 180°C possesses a tensile strength of at least Rm ≥ 500 MPa and/or at a temperature of essentially 180°C possesses a yield strength of at least $Rp_{0.2}$ ≥ 470 MPa.

The principal idea of the invention is that multilayers or multilayer pressed packets are produced or realized with the help of a partition that possesses certain mechanical properties. The partition of the invention is implemented as a steel sheet, and not as a high-grade steel sheet, and possesses at least a tensile strength of Rm ≥ 500 MPa and/or a yield strength of at least $Rp_{0.2}$ ≥ 470 MPa, at a temperature of essentially 180°C. Here, so-called untreated steel sheets may be used as the partitions. But surface-treated steel sheets are preferably used as the partitions, as will be clarified below.

The principle of the invention is, in the production of multilayers or a multilayer pressed packet, not to use aluminum pressing sheets or even high-grade steel sheets, but rather steel sheets, which have a thickness of at least 0.3 mm, preferably a thickness of 0.4 mm, thus once more constructed additionally "thinner" due to their stated mechanical strength values, than the partitions that have been used up to now in the state of the art having a thickness of ca. 0.5 mm. Thus in the production of these partitions implemented as steel sheets, especially in cold rolling, it is necessary, for example, that the best surface condition be observed, specifically that the corresponding steel sheets be produced free from cracks and pores. Additionally, due to the decrease in the thickness of the steel sheet to "only 0.4 mm" (or less), the complement of a press, namely with the corresponding number of multilayers per packet, is correspondingly increased. Now per load/press opening space saving of 1.6 mm is realized (whereby up to now the layering has essentially comprised 14 multilayers and hence has required 16 partitions) with a corresponding reduction in the thickness of the partitions specified in the invention from 0.5 to 0.4 mm. With this, additional room for an additional multilayer is created in the multilayer pressed packet, so that the number of multilayers in the packet is increased to 15. With a further reduction in the thickness of the steel sheet, for example to 0.3 mm, a corresponding greater savings of space can be achieved. This produces a cost saving in the production of the multilayers, as in one manufacturing process now a larger number of multilayers can be produced, thus reducing processing and energy costs.

There now is a multitude of possibilities for structuring and refining the partition specified in the invention or the method for producing a partition as specified in the invention, along with the method for producing the multilayer pressed packet using the partition in an advantageous manner. Several exemplary embodiments for the partition specified in the invention or for the method specified in the invention will be described in greater detail below with reference to the following description and the attached drawings, wherein:

DETAILED DESCRIPTION

Figure 1:
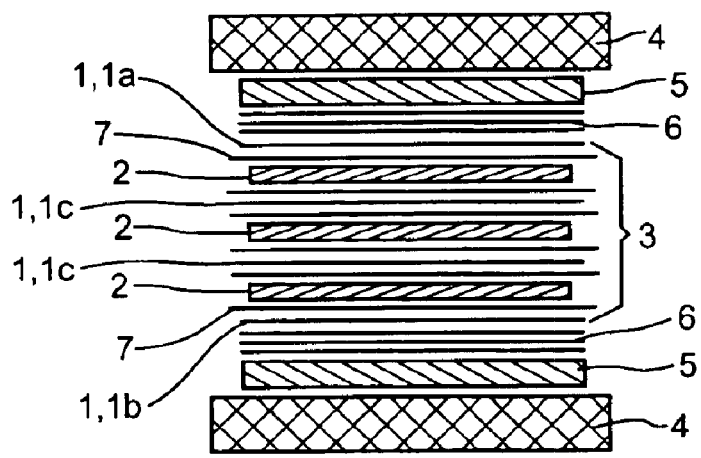
FIG. 1 illustrates a schematically simplified lateral representation of the construction of a multilayer pressed packet for use in producing the corresponding multilayers (printed circuit boards)
Figure 2:
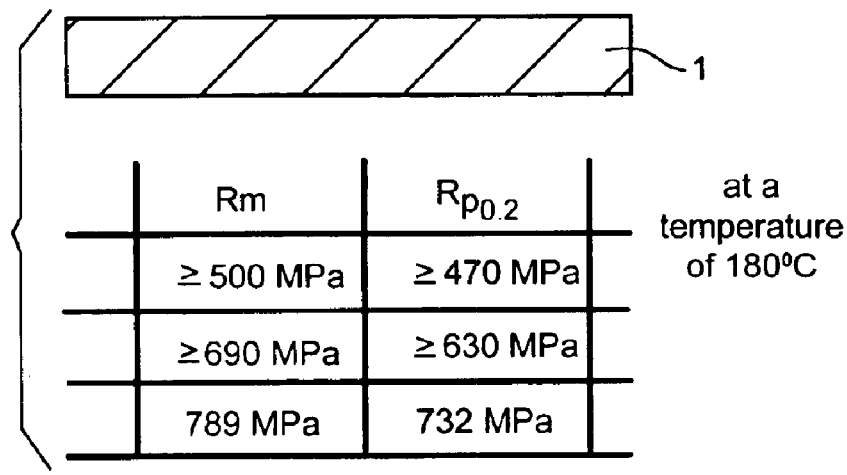
FIG. 2 illustrates a simplified schematic lateral representation of a first embodiment of the partition specified in the invention, including a table of preferred values for the desired mechanical strength values or the desired ranges
Figure 3:
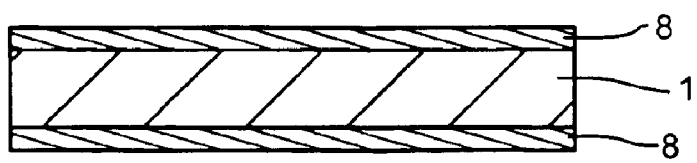
FIG. 3 illustrates a second embodiment, namely a surface-treated partition in a simplified schematic representation from the side.

FIG. 1 shows a schematic representation of the structure of a multilayer pressed packet 3 having several partitions 1 and multilayers 2. FIG. 2 shows a partition 1 with a corresponding table indicating the desired or preferred mechanical strength values, and finally FIG. 3 shows a surface-treated partition 1. The invention is concerned with partitions 1 that are provided in the lamination of multilayer printed circuit boards-pressed packets.

In FIG. 1, a multilayer pressed packet 3 is shown in a schematic representation. As is apparent, the multilayer pressed packet 3 is arranged in a corresponding press, which is not shown in detail here, namely between the press plates 4 and the pressing tools 5 of the press. In order to enable an optimal arrangement of the multilayer pressed packet 3, here additional pressing pads 6 are provided between the outer partitions 1a and 1b of the multilayer pressed packet 3. The multilayer pressed packet 3 now consists of several multilayers 2 and several partitions 1, namely an outer, upper partition 1a, an outer, lower partition 1b, and several middle partitions 1c. The multilayers 2 are correspondingly arranged between the individual partitions 1, which have the customary structure, which is not shown in detail here. The multilayers 2 have corresponding, multi-ply layers, namely corresponding sheet molding compound layers or laminate layers, and a corresponding number of copper foils, not represented here in detail, for the realization of the corresponding wiring paths. All of this is known in detail, and will not be further discussed here.

Additionally, however, it is also apparent in FIG. 1 that between the multilayers 2 and the partitions 1 corresponding partition foils, namely copper foils 7, are provided. Preferably, the partitions 1 and the copper foils 7 are produced as a composite, which will be described in detail below. It is also possible to substitute copper foils 7 of this type by providing a partition 1 with an anti-stick coating.

In the pressing of the multilayer 2, in other words the individual layers/plies of each multilayer represented in FIG. 1, to a corresponding composite, a temperature of ca 180°C preferably prevails inside the press. During the pressing process, the partitions 1 guarantee an even distribution of heat within the multilayer pressed packet 3, while ensuring an even distribution of pressure. Otherwise the heat and pressure distribution within the multilayer pressed packet 3 would be uneven, so that some areas of the multilayer 2 would begin to flow before others, which would lead to air locks, a thickness distribution that is outside of required tolerances, etc., and—in the final analysis—would lead in the cross-section of the individual multilayers 2 to a varied copper distribution in overlapping plies of an individual multilayer 2 and to insufficient lamination around copper-poor points. In the final analysis, the structure/implementation of the partitions 1 is thus of decisive importance in producing optimal multilayers 2, specifically in preventing possible surface defects in a multilayer 2 on one hand, and in preventing these types of surface defects on adjacent multilayers 2 from pushing off inside the multilayer pressed packet 3 on the other hand. However, partitions that have been used in the prior art up to now are not yet optimally designed for this.

The disadvantages described at the beginning are now prevented in that partition 1 is implemented as a steel sheet, but not as a high-grade steel sheet, and the steel sheet—at a temperature of essentially 180°C—possesses a tensile strength of at least Rm ≥ 500 MPa and/or—at a temperature of essentially 180°C—a yield strength of at least $Rp_{0.2}$ ≥ 470 MPa. In other words, in the process for producing the partition 1 for a multilayer pressed packet 3, the partition 1 is made of a steel sheet, whereby the steel sheet or its alloy is selected such that the steel sheet—at a temperature of essentially 180°C—possesses a tensile strength of at least Rm ≥ 500 MPa and/or—at a temperature of essentially 180°C—a yield strength of at least $Rp_{0.2}$ ≥ 470 MPa.

Although both alternatives are mentioned here (thus the partition 1 or the partitions 1 represented in FIG. 1 through 8, can possess a tensile strength of at least Rm ≥ 500 MPa or a yield strength of at least $Rp_{0.2}$ ≥ 470 Mpa), the combination of both strength values, in other words the realization of a tensile strength of at least Rm ≥ 500 MPa and the realization of a yield strength of at least $Rp_{0.2}$ ≥ 470 MPa (each at a temperature of ca. 180°C) is optimal. It has been shown that a partition 1 that is implemented as a steel sheet and possesses precisely these minimum strength values is optimally suited for use in the production of the multilayer 2 or the multilayer pressed packet 3. The "image transfer" is correspondingly avoided with the use of these partitions 1, while the multilayers 2 that are produced have an optimal surface, and the partitions 1 specified in the invention can also be used several times, which once again results in a corresponding cost savings.

FIG. 2 with its table shows a partition 1 as specified in the invention, which is implemented as a steel sheet. In the table, corresponding strength values for the yield strength $Rp_{0.2}$ and for the tensile strength Rm are indicated, but each at temperatures of 180°C, in other words essentially for the temperature that prevails within a multilayer pressed packet 3 during a corresponding pressing of the multilayers 2. From the table in FIG. 2 it is quite clear that the minimum values for tensile strength lie at Rm ≥ 500 MPa and for yield strength at $Rp_{0.2}$ ≥ 470 MPa. Nevertheless, it has been shown that multilayers 2 having particularly good properties can be produced, and image transfer can be particularly well prevented, when the tensile strength is Rm ≥ 690 MPa and the yield strength is $Rp_{0.2}$ ≥ 630 MPa. In the preferred embodiment of a partition 1 of the invention, the strength values are Rm=789 MPa and $RP_{0.2}$=732 MPa.

While FIG. 2 shows an untreated, especially a surface untreated partition 1 made of steel, FIG. 3 shows a surface-treated or surface-processed, especially a coated partition 1. The partition 1 shown in FIG. 3 and implemented as a steel sheet here is essentially surface-treated. Namely it is coated on both sides. The partition 1 shown in FIG. 3 also possesses essentially the mechanical strength values or strength ranges listed in the table in FIG. 2. The thickness of the partition 1 ranges from 0.3 to 1 mm, and preferably the partition 1 has a thickness of 0.3 to 0.5 mm, but especially a thickness of 0.4 mm. The supplementary coating 8 on the partition 1 that is shown in FIG. 3 can be realized in different methods and manners, for example it can be an organic, an inorganic, or a metallic coating 8. A plating of aluminum or copper may be produced as a metallic coating 8. An especially galvanic applied coating 8 made of chromium is also possible. The thicknesses of the partition 1 or the coating 8 are only schematically represented in FIG. 3. The dimensions of the thickness of the coating 8 will be specified in greater detail below.

Thus a plating of the partition 1 as a coating 8 is possible, for example a plating with aluminum or copper, whereby the last-mentioned support metals have improved heat conduction properties, and can therefore correspondingly the conductance of heat within a multilayer pressed packet 3.

It is also possible for the coating 8 to be implemented as an organic or inorganic coating. For example a lubricant may be applied to the partition 1. Preferably, the lubricant can be produced from an olefin base, or some other organic substance that possesses similar properties may be applied as the coating 8. An inorganic coating 8 could also be realized, for example, from a plastic base.

While the partition 1 that is implemented as a steel sheet preferably has a thickness of 0.4 mm, the thickness of the coating 8 should amount to at least 2 Πm, and should preferably lie within a range of 5 to 25 Πm, especially in the case of a metallic coating 8. With the help of a coating 8, even more optimal surfaces for multilayers 2 can be produced, and in particular, damage to the corresponding copper foils 7 can be prevented to the greatest possible extent.

It is important to mention once again that no high-grade steels should be used here as the steel sheet. Although untreated steel sheets, in other words steel sheets that have not been surface-treated or coated, may also be used as the partitions 1 in the production of corresponding multilayers 2, or in the production of corresponding multilayer pressed packets 3, particular care attention must be paid to the surfaces of the partitions 1 that are used, as especially flawless surfaces will also prevent any damage to the copper foils 7 or multilayers 2. Especially in order to produce smoother surfaces, the steel sheet may also be provided with a lubricating agent in addition to the coating 8, however it is also important that during cold rolling the best surface condition of the steel sheet be obtained, in other words that the surface be produced without cracks and pores.

The use of the above-described partitions 1 implemented as steel sheets has proven particularly advantageous if the partitions 1 that are implemented as steel sheets possess the corresponding strength values indicated above. Further of particular advantage is the relatively low thermal expansion of the partitions 1 that are implemented as steel sheets, so that any displacement/slippage or movement within the individual layers/plies of the multilayer 2 during the pressing or the corresponding prevailing temperatures of essentially 180°C can be prevented.

Preferably, the partition 1 represented here is produced in a composite with a copper foil that is not illustrated here in FIGS. 2 and 3, as is, for example, described in detail in DE 198 31 461 C1. This especially produces the advantage that the very thin copper foils, which in part simply can no longer be manually placed, can be properly inserted into the multilayer pressed packet 3 along with the partition 1, rapidly and without a special process step, in order to produce corresponding multilayers 2.

Furthermore, reference may now be made to the following: In the state of the art, partitions having a thickness of 0.5 mm have preferably been used up to now. Based upon the above-indicated strength values for the partitions 1 used here in accordance with the invention, the thickness of these partitions 1 can be reduced to preferably 0.4 mm, even to 0.3 mm. Because up to now in the prior art, a multilayer pressed packet 3 could have a total (per press opening) of 14 multilayers 2 (in FIG. 1 "only" three multilayers 2 are schematically represented), for which 16 partitions are then used, with a reduction of thickness to preferably 0.4 mm a total space savings of 1.6 mm (16×(0.5–0.4 mm)) is achieved when the partitions 1 specified in the invention are used. In this manner, in a multilayer pressed packet 3, additional space for one additional multilayer 2 is created, so that the total number of multilayers 2 arranged within a multilayer pressed packet 3 can be increased from 14 multilayers 2 to 15 multilayers 2. With a further reduction in thickness to 0.3 mm, further additional space is created. In this manner, greater production costs, especially labor and energy costs, can be saved.

One of the preferred partitions 1 as specified in the invention has especially the following composition: 0.04% by weight C, 0.01% by weight Si, 0.22% by weight Mn, 0.012% by weight P, 0.005% by weight S and 0.037% by weight Al; with the remaining percentage by weight being the corresponding Fe portion. The steel alloy described here is also referred to as "ST2 K70 RP". Other steel alloys, for example similar to "C75", that would possess the corresponding mechanical strength values are also possible. The partitions specified in the invention preferably have a length of 660 mm and a width of 580 mm.

The partition 1 specified in the invention, or the steel sheet specified in the invention, which then can be inserted as a pressing sheet in the composite of a multilayer pressed packet 3 to be produced, is preferably produced from an unalloyed carbon steel, that is, not from an alloyed steel. Partitions 1 as specified in the invention that are implemented as unalloyed steel sheets have essentially the following composition: Between 0.03 and 1.2% by weight C (carbon) and 0.2 to 1.5% by weight Mn (manganese). Particularly preferred ranges for the corresponding unalloyed carbon steel or for the unalloyed steel sheet are 0.03 to 0.1% by weight C and 0.2 to 0.5% by weight Mn. The remaining percentages by weight form essentially the corresponding Fe share. In this, the unalloyed carbon steel, that is the steel sheet of the invention, may also contain slight traces of other elements, such as phosphorous, sulphur, aluminum and/or silicon, however these have no effect at all on the quality of the steel.

Especially in order to prevent the image transfer described at the beginning, the mentioned yield strength $Rp_{0.2}$ is of decisive importance. Specifically, if the yield strength $Rp_{0.2}$ is too low, then especially the partitions used in the prior art will be subject to a permanent form change, whereupon the above-described image transfer will occur when this partition is reused. It has been shown that this image transfer can be prevented with the yield point of $Rp_{0.2}$ τ 470 MPa described in the invention, since when the partition 1 specified in the invention is reused, it is ensured that it is subjected to no lasting changes in shape due to the correspondingly established yield strength. Hence it can be used several times without image transfer occurring.

As the lubricating agent, a lubricant produced from an olefin base is preferably used. Also possible are polyolefin-based polymers or polyolefin emulsions, for example suspended polyolefin/water solutions. When these are used, a good corrosion protection for the partitions 1 specified in the invention is guaranteed, and a good anti-stick coating, especially against resins, is also achieved.

The partitions 1 specified in the invention preferably possess good heat conductivity of essentially 40 to 60 W/mK, and/or a thermal expansion coefficient of between 9 and 14 $10^{-6} K^{-1}$.

A further preferred embodiment of the partition 1 specified in the invention has the following composition: 0.037% by weight C, 0.003% by weight Si, 0.21% by weight Mn, 0.003% by weight phosphorous, 0.01% by weight sulphur, 0.039% by weight aluminum, and 0.020% by weight chromium, with the remaining percentage by weight being the corresponding Fe share, and the portions of phosphorous, sulphur, aluminum, chromium, and silicon are to be viewed here as "impurities". The above-named composition is preferably essentially produced from cold-rolled band steel, similar to "DC04", and possesses essentially a heat conductivity of 57 W/mK and a thermal expansion coefficient of 11.45 $10^{-6} K^{-1}$. A coating 8 is preferably provided for the latter, further preferred embodiment, which is implemented as a thin plating of chromium, and has a coating thickness of 70 to 130 mg/m$^2$.

In summary, with the partition 1 specified in the invention, and/or with the method for producing the partition 1 specified in the invention, significant advantages are achieved, and the disadvantages known from the prior art are prevented.

List of Reference Numbers
1 Partition
1a Upper partition
1b lower partition
1c Middle partition
2 Multilayer
3 Multilayer pressed packet
4 Pressing plate
5 Pressing tool
6 pressing pad
7 Copper foil
8 Coating

What is claimed is:

1. A partition for use in the production of one or more multilayers or a multilayer pressed packet, wherein the partition can be placed as a pressing sheet in the composite of a multilayer pressed packet to be produced, especially between two multilayers, characterized in that the partition is implemented as a steel sheet, but not as a high-grade steel sheet, that the steel sheet at a temperature of essentially 180° C. possesses a tensile strength of at least $Rm \geq 500$ MPa and at a temperature of essentially 180° C. a yield strength of at least $Rp_{0.2} \geq 470$ MPa.

2. The partition according to claim 1, characterized in that the steel sheet is essentially completely surface-treated.

3. The partition according to claim 1, characterized in that the steel sheet has a thickness of 0.3 to 0.5 mm.

4. The partition according to claim 1, characterized in that additionally the steel sheet has an organic, inorganic, or metallic coating.

5. The partition according to claim 4, characterized in that the metallic coating (is made of aluminum or copper.

6. A partition, for use in the production of one or more multilayers or a multilayer pressed packet, wherein the partition can be placed as a pressing sheet in the composite of a multilayer pressed packet to be produced, especially between two multilayers, characterized in that the partition is implemented as a steel sheet, but not as a high-grade steel sheet, that the steel sheet at a temperature of essentially 180° C. possesses a tensile strength of at least $Rm \geq 500$ MPa and/or at a temperature of essentially 180° C. a yield strength of at least $Rp_{0.2} \geq 470$ MPa characterized in that the steel sheet has an organic coating that is applied as a lubricating agent.

7. The partition according to claim 6, characterized in that the lubricating agent is produced from an olefin base.

8. The partition according to claim 4, characterized in that the coating has a thickness of at least 2 Πm.

9. The partition according to claim 1, characterized in that at least one surface of the steel sheet is covered with a copper foil.

10. The partition according to claim 1, characterized in that the steel sheet has a tensile strength of at least $Rm \geq 690$ MPa and a yield point of at least $Rp_{0.2} \geq 630$ MPa.

11. The partition according to claim 1, characterized in that the steel sheet is comprised of an unalloyed carbon steel.

12. The partition according to claim 11, characterized in that the steel sheet is comprised of 0.03 to 1.2% by weight C and 0.2 to 1.5% by weight Mn portions.

13. The partition according to claim 12, characterized in that the steel sheet is comprised of 0.03 to 1.0% by weight C and 0.2 to 0.5% by weight Mn portions.

14. The partition according to claim 11, characterized in that the steel sheet contains slight traces of phosphorous, sulphur, aluminum, and/or silicon.

15. The partition according to claim 6, characterized in that the lubricating agent is a polymer with a polyolefin base.

16. The partition according to claim 4, characterized in that the metallic coating is implemented as a thin layer chromium plating.

17. A method for producing a partition for a multilayer pressed packet, especially a partition pursuant to claim 1, wherein the partition can be placed as a pressing sheet in the composite of a multilayer pressed packet to be produced, especially between two multilayers, characterized in that the partition is implemented as a steel sheet, but not as a high-grade steel sheet, that the steel sheet at a temperature of essentially 180° C. possesses a tensile strength of at least $Rm \geq 500$ MPa and/or at a temperature of essentially 180° C. a yield point of at least $Rp_{0.2} \geq 470$ MPa.

18. The method according to claim 17, characterized in that the steel sheet is essentially completely surface-treated.

19. The method according to claim 17, characterized in that the steel sheet is produced in a thickness of 0.3 to 0.5 mm.

20. The method according to claim 17, characterized in that the steel sheet is additionally provided with an organic, inorganic, or metallic coating.

21. The method according to claim 20, characterized in that the steel sheet is produced with a metallic coating made of aluminum or copper.

22. A method for use in the production of one or more multilayers or a multilayer pressed packet, comprising placing a partition as a pressing sheet in the composite of a multilayer pressed packet to be produced, especially between two multilayers, characterized in that the partition is implemented as a steel sheet, but not as a high-grade steel sheet, that the steel sheet at a temperature of essentially 180° C. possesses a tensile strength of at least $Rm \geq 500$ MPa and at a temperature of essentially 180° C. a yield strength of at least $Rp_{0.2} \geq 470$ MPa characterized in that a lubricating agent is applied as an organic coating to said steel sheet.

23. The method according to claim 20, characterized in that the coating is produced with a thickness of at least 2 Πm.

24. The method according to claim 17, characterized in that at least one surface of the steel sheet is covered with a copper foil.

25. The method according to claim 17, characterized in that the steel sheet is produced from such a material and treated such that the steel sheet that is produced has a tensile strength of at least $Rm \geq 690$ MPa and a yield point of at least $Rp_{0.2} \geq 630$ MPa.

26. The method according to claim 17, characterized in that the steel sheet is produced from an unalloyed carbon steel.

27. The method according to claim 26, characterized in that the steel sheet contains 0.03 to 1.2% by weight C and 0.2 to 1.5% by weight Mn portions.

28. The method according to claim 27, characterized in that the steel sheet contains 0.03 to 0.1% by weight C and 0.2 to 0.5% by weight Mn portions.

29. The method according to claim 26, characterized in that the steel sheet contains slight traces of phosphorous, sulphur, aluminum, and/or silicon.

30. The method according to claim 22, characterized in that the lubricating agent is a polymer with a polyolefin base.

31. The method according to claim 20, characterized in that the coating is implemented as a thin layer chromium plating.

32. A method for producing a multilayer pressed packet, wherein a partition can be placed as a pressing sheet in the composite of a multilayer pressed packet to be produced, especially between two multilayers, characterized in that a partition in accordance with claim 1 is used.

33. A multilayer pressed packet for the production of one or more multilayers, characterized in that at least one partition in accordance with claim 1 is inserted within the multilayer pressed packet.

34. A method for producing a multilayer pressed packet, wherein a partition can be placed as a pressing sheet in the composite of a multilayer pressed packet to be produced, especially between two multilayers, characterized in that a partition produced in accordance with claim 17 is used.

35. The partition according to claim 1, further having a thermal conductivity of 40–60 W/mk.

* * * * *